United States Patent [19]
Lai et al.

[11] Patent Number: 6,042,404
[45] Date of Patent: Mar. 28, 2000

[54] EJECTOR MECHANISM OF A CONNECTOR

[75] Inventors: Ming-Chun Lai, Shin-Juang; Shun-Chi Tung, Tu-Chen, both of Taiwan

[73] Assignee: Hon Hai Precision Ind. Co., Ltd., Taipei Hsien, Taiwan

[21] Appl. No.: 09/221,004

[22] Filed: Dec. 23, 1998

[30] Foreign Application Priority Data

May 8, 1998 [TW] Taiwan .................................. 87207129

[51] Int. Cl.⁷ .................................................. H01R 13/62
[52] U.S. Cl. ............................................................ 439/159
[58] Field of Search .................................... 439/159, 160, 439/152, 153, 157, 154, 155

[56] References Cited

U.S. PATENT DOCUMENTS

| | | | |
|---|---|---|---|
| 5,149,276 | 9/1992 | Dixon | 439/159 |
| 5,286,214 | 2/1994 | Takahashi | 439/159 |
| 5,890,920 | 4/1999 | David et al. | 439/159 |

*Primary Examiner*—Gary F. Paumen
*Assistant Examiner*—Tho D. Ta

[57] ABSTRACT

An ejector mechanism for a connector having a header, comprises a lever having an intermediate portion pivotably engaged with the header of the connector, and a driving member and an engagement portion formed on opposite sides of the intermediate portion. An ejection plate is linked to and driven by the driving member of the lever and defines a channel device in one side thereof. A push bar is slidably received in the channel device of the ejection plate and an end thereof engages with the engagement portion of the lever whereby the push bar can move the ejection plate via the driving member of the lever.

19 Claims, 6 Drawing Sheets

EJECTOR MECHANISM OF A CONNECTOR

BACKGROUND OF THE INVENTION

1. Field of the Invention

The present invention relates to an ejector mechanism of a connector, and especially to an ejector mechanism for use in a PCMCIA connector.

2. The Prior Art

PCMCIA card connectors have become popular for use in portable computers. Normally, PCMCIA card connectors are configured with an ejector mechanism having a lever for driving an ejecting plate to disconnect and eject IC cards therefrom. A conventional ejector mechanism, as shown in FIG. 1, is fixed to a frame 10 of the connector. The ejector mechanism comprises a lever 11 pivotably engaged with the frame 10. An ejection plate 12 is pivotably driven by the lever 11 which has one end engaged with a push bar 13. Receptacle parts 14 are formed on one side of the frame 10 for slidably receiving the push bar 13. The formation of the receptacle parts 14 is complicated and costly. For simplifying the structure of the receptacle parts, another connector is provided, as shown in FIG. 2, wherein a lever 20 is pivotably engaged with a frame 25 of a connector. A driving end of the lever 20 is engaged with an ejection plate 21 while another end of the lever 20 is engaged with a push bar 22 which is slidably received in a receptacle 23 formed on one side of the frame 25. Although the receptacle 23 of this connector is simpler than the receptacle parts 14 of the previous connector, the formation of the receptacle 23 on the frame 25 is still laborious and costly.

Hence, it is requisite to provide a new ejector mechanism which does not have a receptacle formed on the frame thereby simplifying manufacture thereof and reducing costs.

SUMMARY OF THE INVENTION

The primary purpose of the present invention is to provide a new ejector mechanism for a card connector which can effectively simplify the frame of the connector thereby reducing manufacturing costs.

In accordance with one aspect of the present invention, an ejector mechanism for a connector having a header, comprises a lever having an intermediate portion pivotably engaged with the header of the connector, and a driving member and an engagement portion formed on opposite sides of the intermediate portion. An ejection plate is linked to and driven by the driving member of the lever and defines channel means in one side thereof. A push bar is slidably received in the channel means of the ejection plate and an end thereof engages with the engagement portion of the lever whereby the push bar can move the ejection plate via the driving member of the lever.

These and additional objectives, features, and advantages of the present invention will become apparent after reading the following detailed description of the preferred embodiment taken in conjunction with the appended drawing figures.

DETAILED DESCRIPTION OF THE PREFERRED EMBODIMENT

Figure 1:
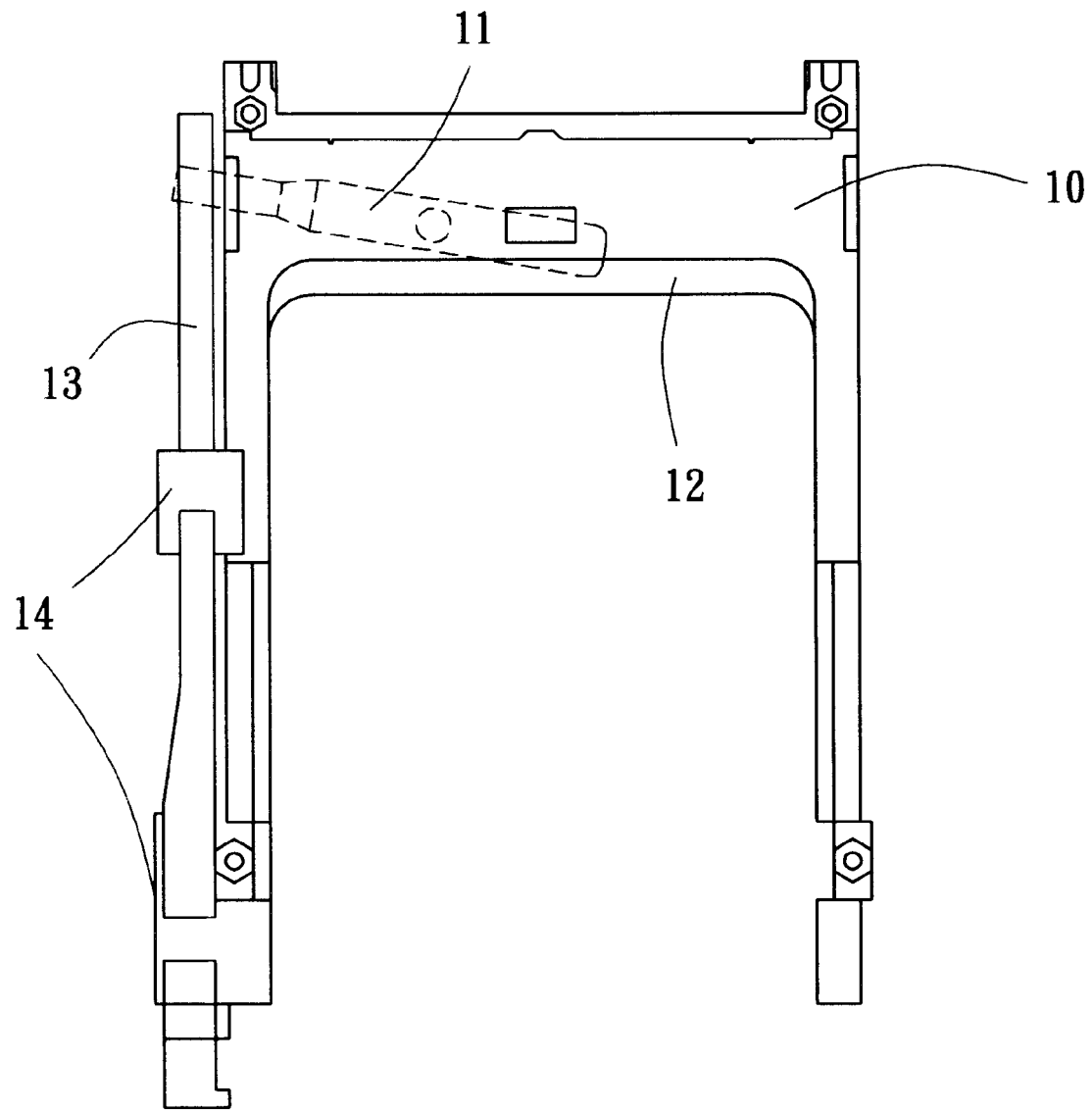
FIG. 1 is a schematic view of a conventional PCMCIA card connector.
Figure 2:
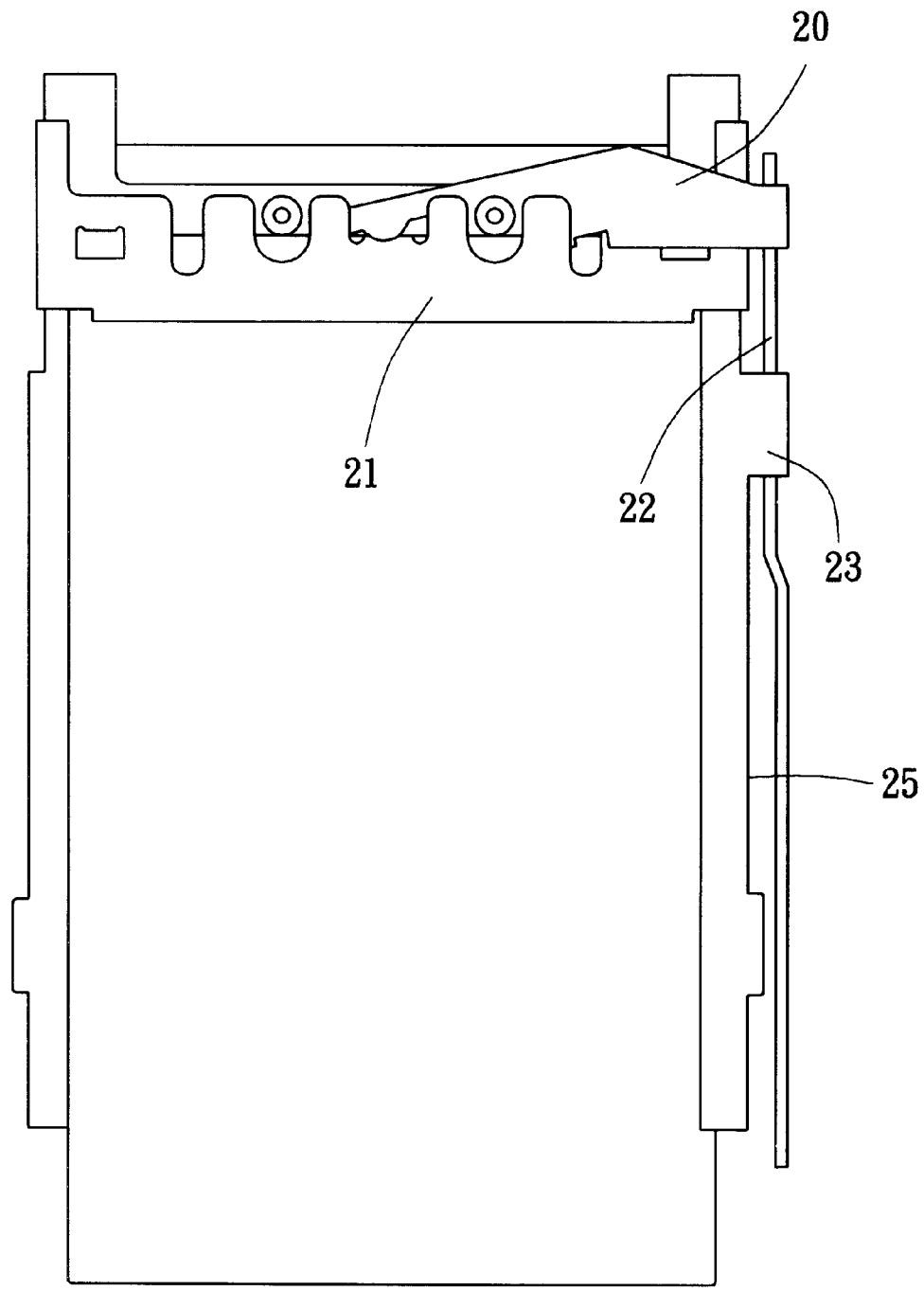
FIG. 2 is a schematic view of another conventional PCMCIA card connector.
Figure 3:
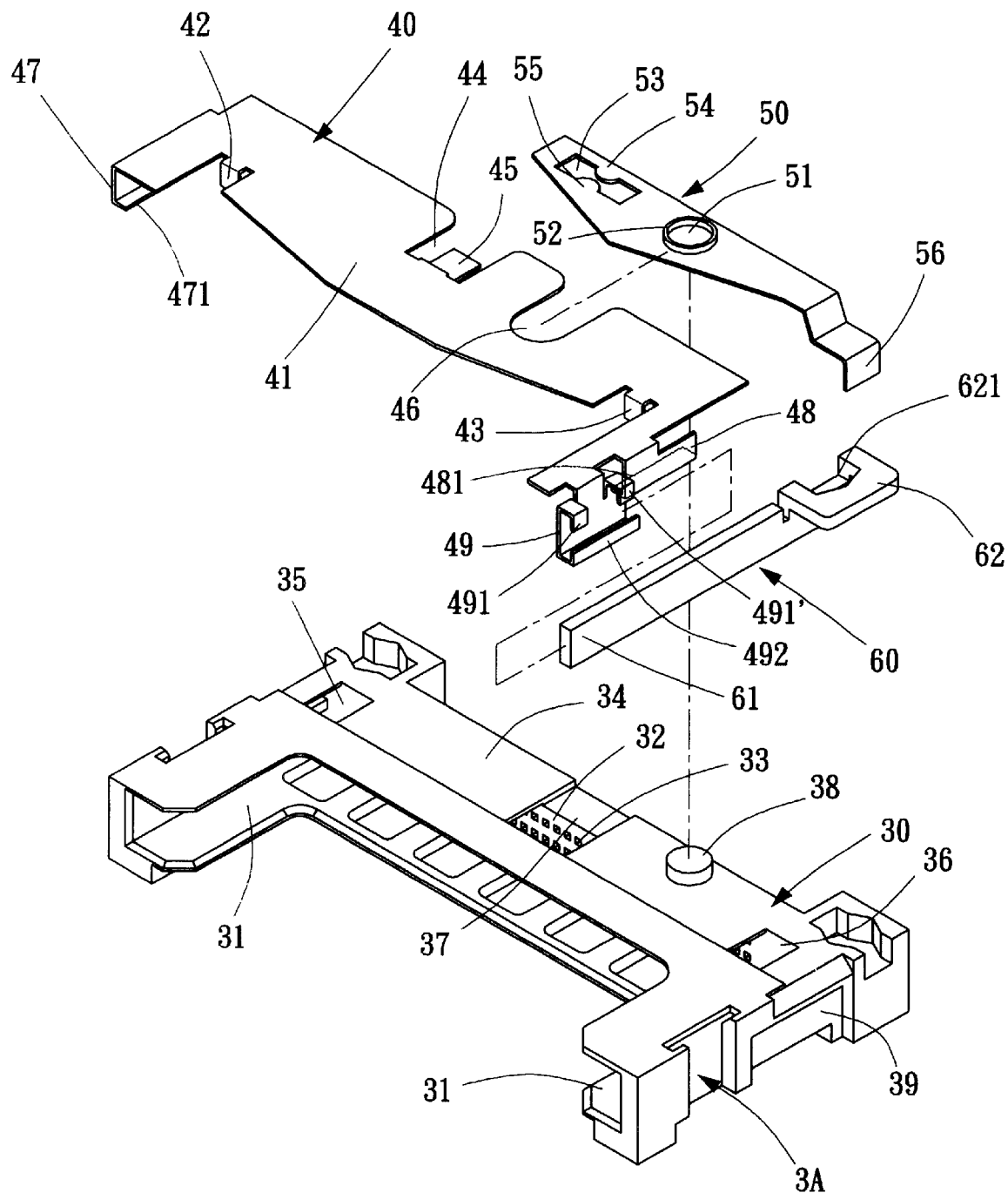
FIG. 3 is an exploded view of a PCMCIA connector in accordance with the present invention.

Referring to FIG. 3, an ejector mechanism for a connector in accordance with the present invention comprises a lever 50, an ejection plate 40, and a push bar 60. The connector comprises a frame 30 and the ejector mechanism. The frame 30 has a header 32 and a U-shaped guiding structure 3A connected to the header 32. The guiding structure 3A defines two channels 31 exposed toward each other for guiding a memory card (not shown) into the header 32. The header 32 defines a plurality of holes 33 for receiving contacts (not shown for simplicity) therein and comprises a cover 34 formed on a top surface thereof. The cover 34 defines a central hole 37 and two side holes 35, 36 at opposite ends thereof. A protrusion 38 projects from the cover 34 between the central hole 37 and the side hole 36. Two concave portions 39 are defined in opposite outer sides of the guiding structure 3A.

The lever 50 defines a hole 51 in a central portion thereof and a rim 52 projects upward from a periphery of the hole 51. An elongate hole 53 is defined near one end of the lever 50 and a stepped member 56 is formed at the other end thereof. The elongate hole 53 defines a narrow portion in the center thereof between two semi-circle portions 54, 55 extending from opposite peripheries thereof.

The ejection plate 40 is a U-shaped metal plate having a middle plate 41 with two engaging arms 47, 48 extending from opposite ends thereof. The middle plate 41 defines a first cutout 44 and a second cutout 46 exposed to a rear edge thereof and has two ejection tabs 42, 43 extending downward from a front edge thereof. An L-shaped plate 45 extends downward from a periphery of the first cutout 44. Each engaging arm 47, 48 forms a flange 471, 481 extending toward each other. A receptacle 49 is formed on the engaging arm 48 and comprises two upper hooks 491, 491' and a lower hook 492 extending toward the upper hooks 491, 491'.

The push bar 60 forms a handle 61 at one end thereof and a retention member 62 at another end. The retention member 62 is a U-shaped structure defining a retention hole 621 therein.

Figure 4:
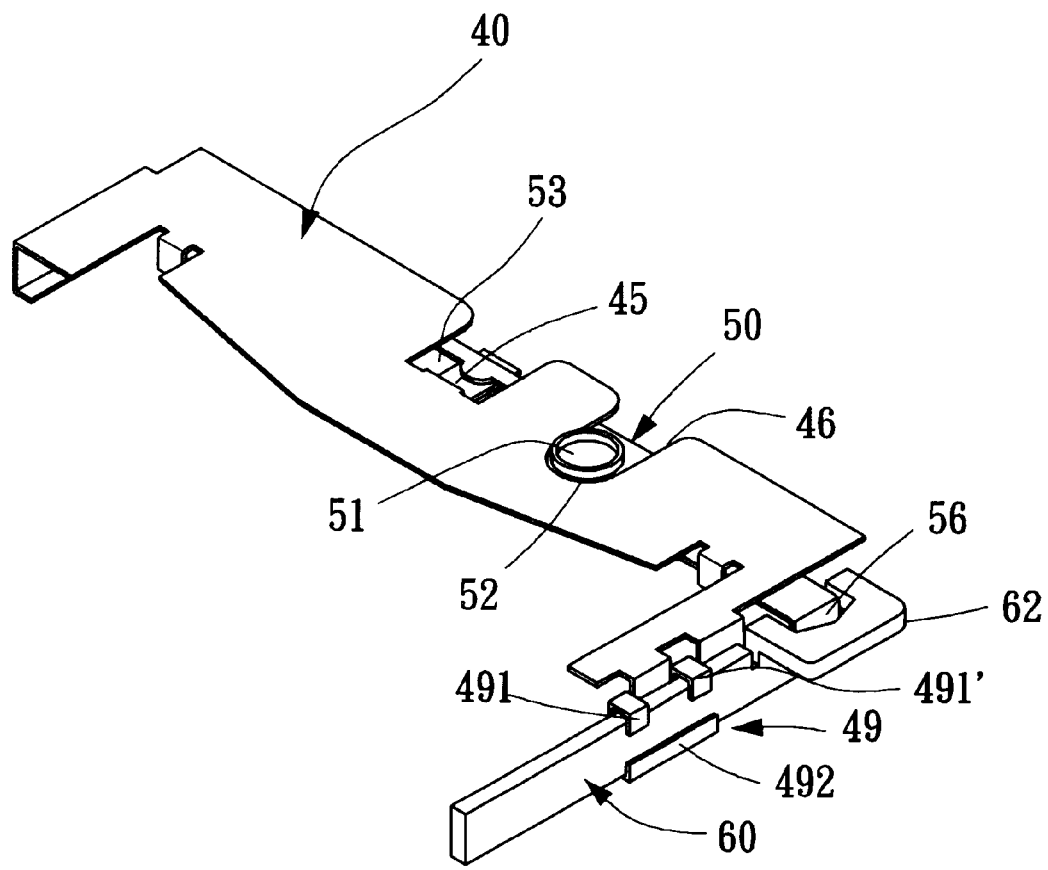
FIG. 4 is an assembled view of an ejector mechanism of FIG. 3.
Figure 5:
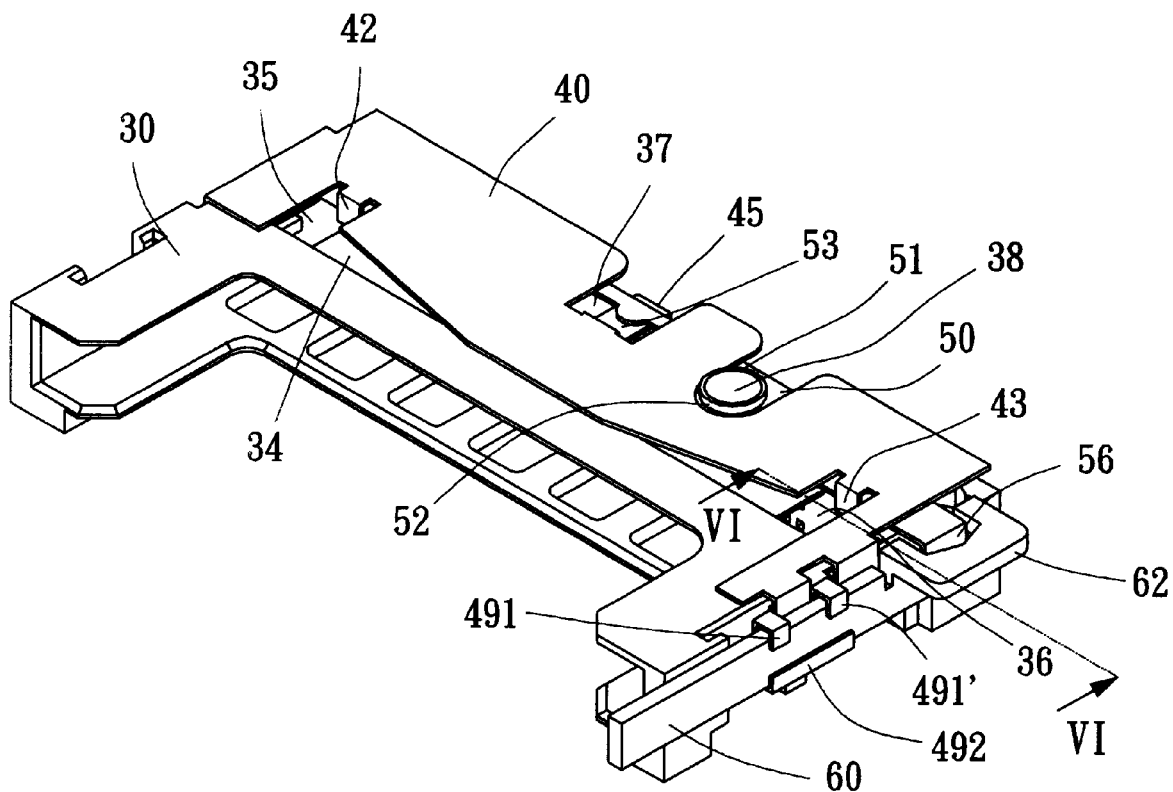
FIG. 5 is an assembled view of FIG. 3.

Referring to FIGS. 3, 4 and 5, the lever 50 is pivotably engaged with the cover 34 by extending the protrusion 38 of the cover 34 into the hole 51 of the lever 50, whereby the rim 52 loosely encloses the protrusion 38 for ensuring proper engagement therebetween. The ejection plate 40 is movably connected to the lever 50 by extension of the L-shaped plate 45 thereof into the elongate hole 53 of the lever 50. The L-shaped plate 45 moves within the central hole 37 of the cover 34 when driven by either of the semi-circle portions 54, 55 in opposite directions.

The second cutout 46 of the ejection plate 40 has a width greater than the diameter of the rim 52 and the rim 52 extends beyond a top surface of the ejection plate 40. Therefore, the ejection plate 40 can move on the cover 34 without being blocked by the rim 52. The ejection tabs 42, 43 are movably located within the side holes 35, 36 of the cover 34 so as to eject a card (not shown) when the ejection plate 40 is driven by the lever 50 to move in a direction opposite to the insertion direction of the card.

Figure 6:
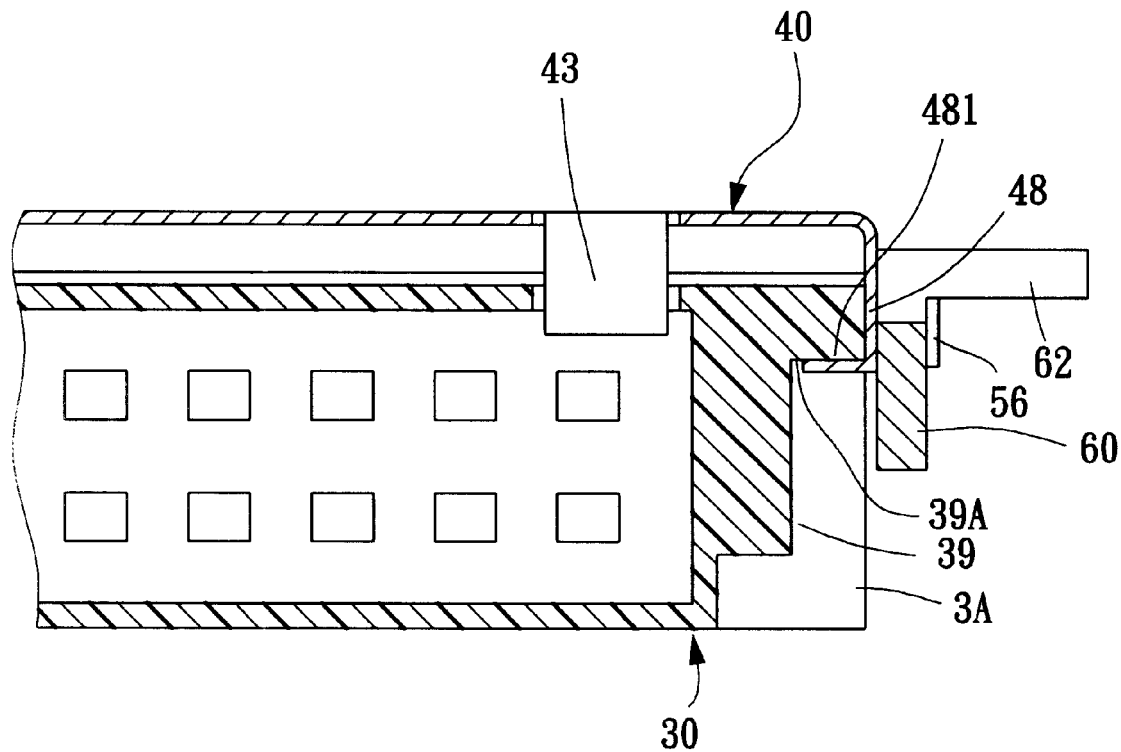
FIG. 6 is a cross-sectional view taken along line VI—VI of FIG. 5.

Also referring to FIG. 6, the ejection plate 40 is slidable on the frame 30, with the flanges 471, 481 of the engaging arms 47, 48 being slidably engaged with respective upper sides 39A of the concave portions 39 of the guiding structure 3A.

Further referring to FIGS. 3, 4 and 5, the push bar 60 is slidably received in the receptacle 49, with a portion thereof being loosely enclosed by the upper hooks 491, 491' and the lower hook 492 of the receptacle 49. The stepped member 56 of the lever 50 is retained in the retention hole 621 of the push bar 60.

In operation, the push bar 60 is manually operated to slide forward in the receptacle 49 causing the lever 50 to rotate about the protrusion 38 thereby moving the ejection plate 40 to eject an inserted card (not shown) by the ejection tabs 42, 43. With this structure, the frame 30 is simplified and the manufacture thereof can be accomplished at a reduced cost.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

What is claimed is:

1. An ejector mechanism for a connector having a header, the ejector mechanism comprising:
    a lever having an intermediate portion pivotably engaged with the header of the connector, and a driving member and an engagement portion on opposite sides of the intermediate portion;
    an ejection plate linked to and driven by the driving member of the lever and defining channel means in one side thereof; and
    a push bar slidably received in the channel means of the ejection plate and having one end engaged with the engagement portion of the lever whereby the push bar can move the ejection plate via the driving member of the lever.

2. The ejector mechanism as claimed in claim 1, wherein the intermediate portion of the lever defines a fulcrum hole pivotably engaged with a protrusion of the header of the connector.

3. The ejector mechanism as claimed in claim 1, wherein the channel means of the ejection plate has a lower L-shaped plate and an upper L-shaped plate extending from a side wall of the ejection plate for slidably receiving the push bar therein.

4. The ejector mechanism as claimed in claim 1, wherein the driving member of the lever is an elongate hole defining a narrow portion between two curved contacting portions extending from opposite peripheries thereof.

5. The ejector mechanism as claimed in claim 4, wherein the ejection plate has a follower portion formed as an L-shaped plate for retention the elongate hole of the lever and driven by either of the curved contacting portions to move in opposite directions at different times.

6. The ejector mechanism as claimed in claim 4, wherein the ejection plate has a follower portion perpendicularly extending from one edge thereof for retention in the elongate hole of the lever and driven by either of the curved contacting portions to move in opposite directions at different times.

7. The ejector mechanism as claimed in claim 6, wherein the ejection plate comprises at least one ejection tab extending downward from an edge thereof opposite the edge from which the follower portion extends.

8. The ejector mechanism as claimed in claim 1, wherein the engagement portion of the lever is a step member.

9. The ejector mechanism as claimed in claim 8, wherein the push bar has a closure member formed at one end thereof for engaging with the step member of the lever.

10. A connector comprising:
    a header engaged with a frame which defines two channels exposed to each other for receiving a card therein; and
    an ejector mechanism comprising a lever having an intermediate portion pivotably engaged with the header and a driving member and an engagement portion formed on opposite sides of the intermediate portion, an ejection plate linked to and driven by the driving member of the lever and defining channel means in one side thereof, a push bar slidably received in the channel means of the ejection plate and having one end engaging with the engagement portion of the lever whereby the push bar can move the ejection plate via the driving member of the lever.

11. The connector as claimed in claim 10, wherein the intermediate portion of the lever defines a fulcrum hole pivotably engaged with a protrusion of the header of the connector.

12. The connector as claimed in claim 10, wherein the channel means of the ejection plate has a lower L-shaped plate and an upper L-shaped plate extending from a side wall of the ejection plate for slidably receiving the push bar therein.

13. The connector as claimed in claim 10, wherein the driving member of the lever is an elongate hole defining a narrow portion between two curved contacting portions extending from opposite peripheries thereof.

14. The connector as claimed in claim 13, wherein the ejection plate has a follower portion formed as an L-shaped plate for retention in the elongate hole of the lever and driven by either of the curved contacting portions to move in opposite directions at different times.

15. The connector as claimed in claim 13, wherein the ejection plate has a follower portion perpendicularly extending from one edge thereof for retention in the elongate hole of the lever and driven by either of the curved contacting portions to move in opposite directions at different times.

16. The connector as claimed in claim 15, wherein the ejection plate comprises at least one ejection tab extending downward from an edge thereof opposite the edge from which the follower portion extends.

17. The connector as claimed in claim 13, wherein the engagement portion of the lever is a step member.

18. The connector as claimed in claim 17, wherein the push bar has a closure member formed at one end thereof for engaging with the step member of the lever.

19. An ejector mechanism for a card connector, comprising:
    a lever having a pivotal point and a driving member and an engagement portion on opposite sides of said pivotal point;
    an ejection plate linked to and driven by the driving member of the lever;
    a push bar having one end engaged with the engagement portion of the lever; and
    means provided with both the push bar and the ejection plate for allowing the push bar to retainably slidably move with regard to the ejection plate; wherein said means defines a channel of the ejection plate and a dimension of said push bar so that the push bar is adapted to be fittingly receivably moved within said channel.

* * * * *